United States Patent [19]

Yoshino et al.

[11] Patent Number: 4,937,521

[45] Date of Patent: Jun. 26, 1990

[54] CURRENT DETECTING DEVICE USING FERROMAGNETIC MAGNETORESISTANCE ELEMENT

[75] Inventors: Yoshimi Yoshino, Inuyama; Tatuya Kakehi, Oobu; Hiroshi Sakurai, Nagoya; Kenichi Ao, Oobu; Toshikazu Arasuna, Kariya; Ichiroh Izawa, Anjo, all of Japan

[73] Assignee: Nippondenso Co., Ltd., Kariya, Japan

[21] Appl. No.: 216,430

[22] Filed: Jul. 7, 1988

[30] Foreign Application Priority Data

Jul. 7, 1987 [JP] Japan .................................. 62-168967
Jul. 14, 1987 [JP] Japan .................................. 62-175063
Nov. 30, 1987 [JP] Japan .................................. 62-302706

[51] Int. Cl.$^5$ ........................ G01R 33/00; G01R 33/06
[52] U.S. Cl. ........................................ 324/117 R; 307/309
[58] Field of Search ................ 324/117 R, 252, 249; 338/32 R; 307/309

[56] References Cited

U.S. PATENT DOCUMENTS 4,024,489  5/1977  Bajorek et al. ............... 338/32 R
4,385,273  5/1983  Lienhard et al. .
4,385,283  5/1983  Delapierre .

FOREIGN PATENT DOCUMENTS 0021916   1/1981   European Pat. Off. .
0030041   6/1981   European Pat. Off. .
0107059   5/1984   European Pat. Off. .
53-118175 10/1978  Japan .
61-80074   4/1986  Japan .
61-225661 10/1986  Japan .

OTHER PUBLICATIONS

Bowen et al; "Magnetoresistive . . . "; IBM Tech. Dis. Bull.; vol. 17; No. 3; Aug. 1974, pp. 728-729.
Feng, J. S.; "Dual Slope . . . ", IBM Tech. Dis. Bull.; vol. 20; No. 2; Jul. 1977; pp. 865-866.
IBM Technical Disclosure Bulletin, vol. 18, No. 8, Jan. 1976, pp. 2745-2748, New York, US; C. H. Bajorek et al.: "Magnetoresistive Current Sensor".
IBM Technical Disclosure Bulletin, vol. 18, No. 11, Apr. 1976, pp. 3847-3851, New York, US; J. S. Feng: "Self-Biased Magnetoresistive Bridge Configuration for Current Measurement".
Radio Fernsehen Elektronik, vol. 34, No. 5, May 1985, pp. 316-319, Berlin, DD; U. Loreit et al.: "Magnetoresistive Sensoren in der Mess- und Speichertechnik".

Primary Examiner—Ernest F. Karlsen
Attorney, Agent, or Firm—Cushman, Darby & Cushman

[57] ABSTRACT

A current detecting device comprises a substrate, a magnetism sensing member made of ferromagnetic magnetoresistance element, an insulating member, and a conducting member, and these members are formed by a photolithography technique such that the magnetism sensing member is electrically isolated from the conducting member by the insulating member. When a current flows into the conducting member, the magnetism sensing member responds to a magnetic field generated by the current. At this time, the resistance of the magnetism sensing member changes due to a magnetoresistance effect in accordance with the intensity of the current. Therefore, the current can be measured by detecting the resistance change. In such a current detecting device, there is no reactance component thereby achieving high sensitivity when detecting the current.

21 Claims, 12 Drawing Sheets

CURRENT DETECTING DEVICE USING FERROMAGNETIC MAGNETORESISTANCE ELEMENT

BACKGROUND OF THE INVENTION

1. Field of the Invention

This invention relates generally to apparatus for measuring the amount of current flowing through a circuit, and particularly to current detecting device used for detecting current flowing through a circuit formed on a substrate.

2. Prior Art

As is well known in the art, in a current measuring apparatus, a coil is used for generating a magnetic field, and a current is detected by means of a detecting device such as a Hall generator and a magnetoresistor. One example of the current measuring apparatus is disclosed in a Japanese Laid-Open Patent Application No. 53-118175, and FIG. 24 shows an example of such a conventional current detecting device. In this example, a wire line 311, in which a current I' flows, is inserted into a ring-shaped magnetic core 312 around which a coil 313 is wound, and a magnetic field H' made by the current I' is detected by measuring a potential difference between two terminals 314a and 314b of the coil 313.

However, the reactance component of the coil 313 exists in the circuit through which a current, which is to be measured, is flowed thereby undesirably influencing input-output characteristics of the current measuring apparatus. Accordingly, it is difficult to produce a highly accurate current measuring apparatus. In addition, since the coil 313 and the detecting device are difficult to unify as one body, the current measuring apparatus cannot be satisfactorily miniaturized. Besides, in the case of assembly, a further manufacturing step is required for adjusting a gap width between the coil 313 and the detecting device because the gap width is technically difficult to uniform in an assembly line.

SUMMARY OF THE INVENTION

The present invention has been developed in order to remove the above-described drawbacks inherent to the conventional current detecting device.

It is, therefore, an object of the present invention to provide a new and useful current detecting device which can be produced by a photolithography technique using a ferromagnetic thin film.

It is another object of the invention to provide a satisfactorily miniaturized current detecting device.

It is a further object of the invention to provide a highly accurate current detecting device.

It is a still further object of the invention to provide a current detecting device which is able to be made as one body with semiconductor integrated circuit.

In accordance with the present invention there is provided a current detecting device comprising: an insulating substrate; a magnetism sensing layer provided on the insulating substrate such that the insulating substrate is partially covered, both ends of the magnetism sensing layer being respectively connected to terminals of first two-terminal means for the measurement of the resistance of the magnetism sensing layer; an insulating layer provided on the magnetism sensing layer; and a conducting layer provided on the insulating layer such that the magnetism sensing layer is substantially located below the conducting layer when viewed from the conducting layer, both ends of the conducting layer being respectively connected to terminals of second two-terminal means for the application of a current to be measured.

In accordance with the present invention there is also provided a current detecting device comprising: a magnetism sensing layer, both ends of the magnetism sensing layer being respectively connected to terminals of first two-terminal means for the measurement of the resistance of the magnetism sensing layer; an insulating layer provided around the magnetism sensing layer thereby forming a sensing member; and two conducting layers each provided at both sides of the sensing member such that the magnetism sensing layer is substantially interposed therebetween, the two conducting layers being connected at a first pair of ends of the sensing member thereby forming a current flowing member, both ends of the current flowing member being respectively connected to terminals of second two-terminal means for the application of a current to be measured.

In accordance with the present invention there is further provided a current detecting device comprising: an insulating substrate; a magnetism sensing layer provided on the insulating substrate, one both ends of the magnetism sensing layer being respectively connected to terminals of first two-terminal means for the application of a constant current and the other both ends of the magnetism sensing layer being respectively connected to terminals of second two-terminal means for the measurement of a potential difference generated by Hall effect; and a conducting layer provided on the insurating substrate, both ends of the conducting layer being respectively connected to terminals of third two-terminal means for the application of a current to be measured.

In accordance with the present invention there is still further provided a current detecting device comprising: an insulating substrate; a conducting layer provided on the insulating substrate such that the insulating substrate is partially covered, both ends of the conducting layer being respectively connected to terminals of first two-terminal means for the application of a current to be measured; an insulating layer provided on the conducting layer; and a magnetism sensing layer provided on the insulating layer such that the conducting layer is substantially located below the magnetism sensing layer when viewed from the magnetism sensing layer, both ends of the magnetism sensing layer being respectively connected to terminals of second two-terminal means for the measurement of the resistance of the magnetism sensing layer.

In accordance with the present invention there is also provided a current detecting device comprising: an insurating substrate; a magnetism sensing layer provided on the insulating substrate so as to extend in a first direction, both ends of the magnetism sensing layer being respectively connected to terminals of first two-terminal means for the measurement of the resistance of the magnetism sensing layer; a first insulating layer provided on the insurating substrate and the magnetism sensing layer; a first conducting layer provided on the first insulating layer so as to extend in a second direction making an angle of approximately 45° with the first direction, both ends of the first conducting layer being respectively connected to terminals of second two-terminal means for the application of a constant current; a second insulating layer provided on the first conducting layer; and a second conducting layer provided on the second insulating layer so as to extend in a third direction making the right angle with the second direction such that the magnetism sensing layer is arranged at the crossing portion of the first and second conducting layers when viewed from the second conducting layer, both ends of the second conducting layer being respectively connected to terminals of third two-terminal means for the application of a current to be measured.

In accordance with the present invention there is further provided a current detecting device comprising: an insulating substrate; magnet means provided on one surface of the insulating substrate such that a line connecting N-pole with S-pole thereof extends in a first direction; a magnetism sensing layer provided on the other surface of the insulating substrate so as to extend in a second direction making an angle of approximately 45° with the first direction, both ends of the magnetism sensing layer being respectively connected terminals of first two-terminal means for the measurement of the resistance of the magnetism sensing layer; an insulating layer provided on the magnetism sensing layer such that the magnetism sensing layer is fully covered; and a conducting layer provided on the insulating layer so as to extend in the first direction, both ends of the conducting layer being respectively connected to terminals of second two-terminal means for the application of a current to be measured, whereby the magnet means, the magnetism sensing layer, and the conducting layer are overlapped.

In accordance with the present invention there is still further provided a current detecting device comprising: a substrate being connected to a first terminal; a conducting member provided on the substrate such that the conducting substrate is partially covered, the conducting member being connected to a second terminal, the first and second terminals formed first two-terminal means for the application of a current to be measured; an insulating layer provided on the substrate; and a magnetism sensing pattern having a plurality of radial line portions, both ends of the magnetism sensing pattern being respectively connected to terminals of second two-terminal means for the measurement of the resistance of the magnetism sensing pattern, the magnetism sensing pattern being provided on the insulating layer such that the conducting member is surrounded by the magnetism sensing pattern.

In accordance with the present invention there is still further provided a current detecting device comprising: a substrate; a conducting member, both ends of the conducting menber being respectively connected to terminals of first two-terminal means for the application of a current to be measured; a magnetism sensing member, both ends of the magnetism sensing member being respectively connected to terminals of second two-terminal means for the measurement of the resistance of the magnetism sensing member; and an insulating member for electrically the isolation between the conducting member and the magnetism sensing member whereby the conducting member, the magnetism sensing member, and the insulating member forms a detecting member, and the detecting member being formed on the substrate.

BRIEF DESCRIPTION OF THE DRAWINGS

The object and features of the present invention will become more readily apparent from the following detailed description of the preferred embodiments taken in conjunction with the accompanying drawings in which.

The same or corresponding elements and parts are designated at like reference numerals throughout the drawings

DETAILED DESCRIPTION OF THE INVENTION

Figure 1:
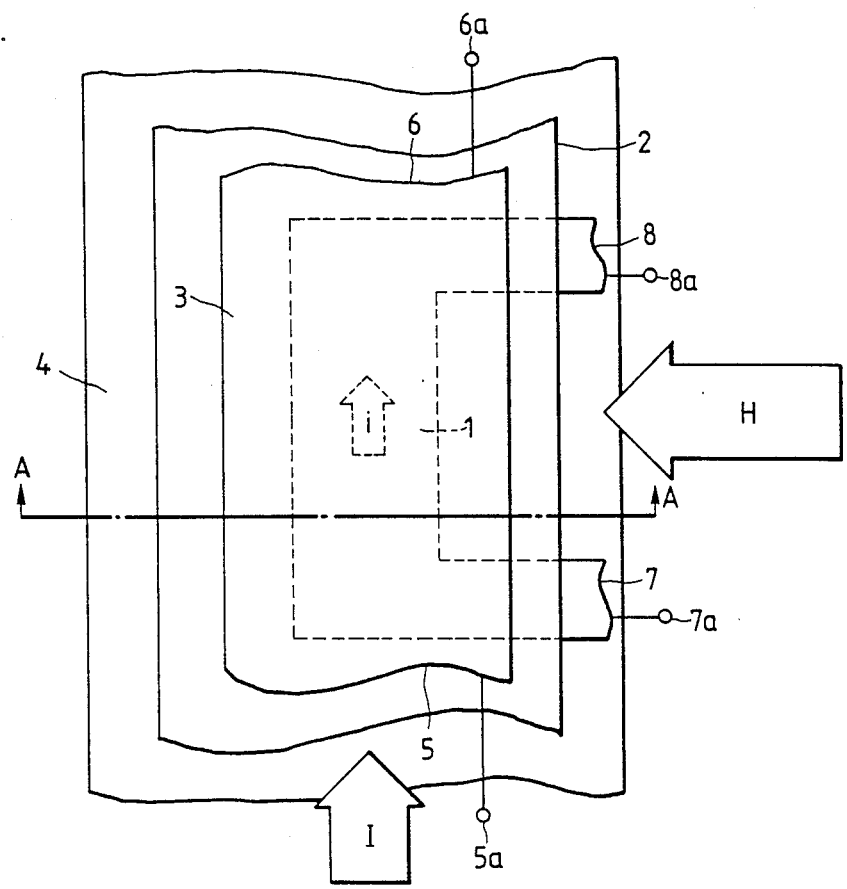
FIG. 1 is a top plan view of a current detecting device according to a first embodiment of the present invention.
Figure 2:
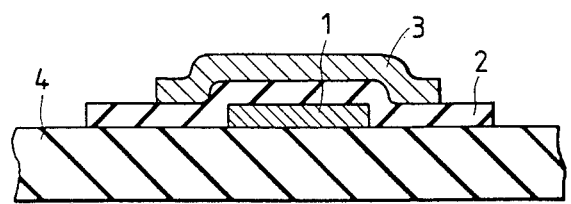
FIG. 2 is a sectional view taken along line A—A of FIG. 1.

Referring now to FIG. 1, a top plan view of a current detecting device is shown as a first embodiment of the present invention, and a sectional view taken along line A—A of FIG. 1 is shown in FIG. 2. In this embodiment, the current detecting device comprises an insulating substrate 4, a magnetism sensing layer made of a magnetoresistor or a magnetoresistance element, i.e. a ferromagnetic magnetoresistance thin film 1, a thin insulating film 2 made by sputtering $SiO_2$ or $Si_3N_4$, and a thin conducting film 3. The ferromagnetic magnetoresistance thin film 1 is formed by etching a magnetism sensing layer made by vapor-depoositing a nickel alloy such as Ni-Co and Ni-Fe on the insulating substrate 4, whereby insulating substrate is partially covered. The insulating thin film 2 is provided on the ferromagnetic magnetoresistance thin film 1, and the conducting thin film 3 is formed by etching a conducting layer made by vapor-depositing aluminum on the insulating thin film 2. At this time, the ferromagnetic magnetoresistance layer 1 is substantially located below the conducting layer 3 when viewed from the conducting layer 3. Thus, in the present current detecting device, the magnetism sensing layer 1 and the conducting layer 3 are electrically isolated from each other. When forming the layer of the ferromagnetic magnetoresistance element 1 and such a conducting layer 3, a photolithographic technique can be used, and when producing the magnetism sensing layer 1 and the conducting layer 3, the method of sputtering, ion-beam depositon, or CVD is also applicable. In addition, the ferromagnetic magnetoresistance thin film 1 can be made of an alloy mainly including Fe, Co, or Ni.

The operation of the current detecting device will be described hereinbelow. The above-mentioned magnetoresistance element 1 has a property that its own resistance value varies when receiving a magnetic field in the direction making the right angle with a current flowing direction. In this embodiment, when a current flows toward an end portion 6 from an end portion 5 of the thin conducting film 3 as shown by an arrow I, a magnetic field is generated in accordance with the intensity of the current. Here, when a constant current is flowed from an end portion 7 toward an end portion 8 of the magnetism sensing layer 1 in the direction of an arrow i, the magnetic field H is applied to the magnetic sensing layer 1 in the horizontal direction to the conducting layer 3 and in the direction making the right angle with the direction of the constant current. Then, the resistance value of the magnetism sensing layer 1 varies in accordance with the intensity of the magnetic field received by the magnetism sensing layer 1 (magnetoresistance effect). Accordingly, the current value of the conducting layer 3 can be obtained by measuring the resistance value of the magnetism sensing layer 1. Terminals 7a and 8a are respectively connected to both ends of the magnetism sensing layer 1 for the measurement of the resistance value of the magnetism sensing layer 1, and terminals 5a and 6a are respectively connected to both ends of the conducting layer 3 for the application of a current which is to be measured.

Figure 3:
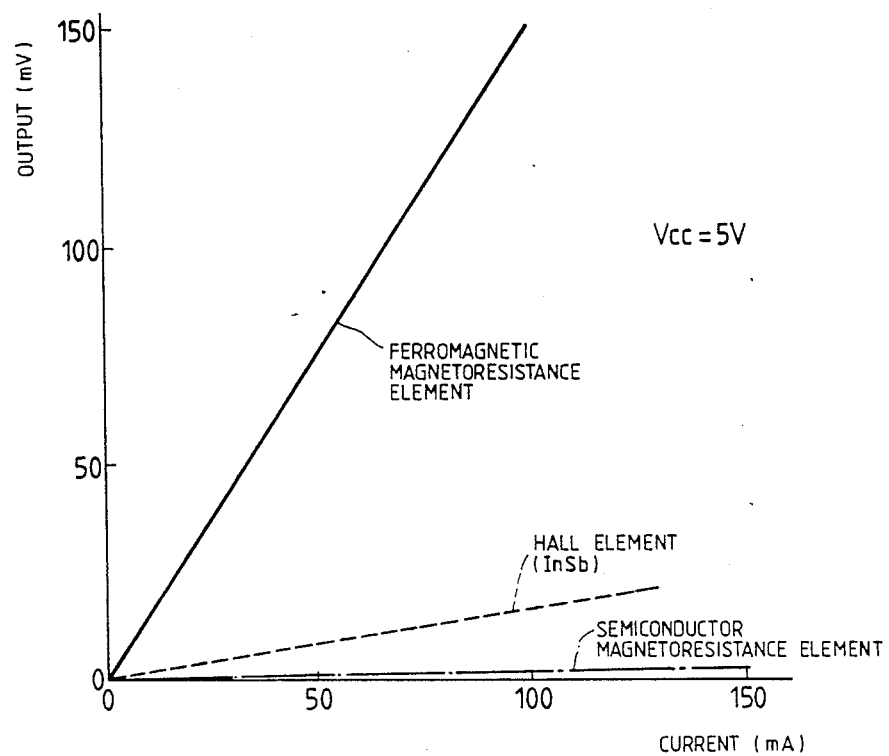
FIG. 3 is a graph showing input-output characteristics of three elements each exhibiting galvanomagnetic effect.

FIG. 3 is a graph showing input-output characteristics of three elements of a ferromagnetic magnetoresistance element, a Hall generator, i.e. Hall element (InSb), and a semiconductor magnetoresistance element. As will be understood from the graph of FIG. 3, the sensitivity of ferromagnetic magnetoresistance element is higher than those of others. Besides, as to the temperature characteristics of those elements, the temperature coefficient of the ferromagnetic magnetoresistance element where the current is constant is $-0.05\%/°C.$; that of the Hall element is $-0.13\%/°C.$; and that of the semiconductor magnetoresistance element is $-2\%/°C$. Therefore, the present current detecting device using a ferromagnetic magnetoresistance element exhibits satisfactory input-output characteristics.

In such a structure, there are some advantageous effects as follows.

(1) Since the current which is to be measured is not required to flow through any coil, there is no undesirable influence due to the reactance component of the coil. Therefore, the response of the current detecting device is improved in comparison with the conventional device.

(2) Since each of the magnetism sensing layer 1, the insulating layer 2, and the conducting layer 3 is a thin film and the forming of these films is performed by a photolithographic technique, the current detecting device is miniaturized with high precision.

(3) Since the ferromagnetic magnetoresistance element is used in the present embodiment, the present current detecting device has high sensitivity thereby exhibiting satisfactory input-output characteristics.

Figure 4:
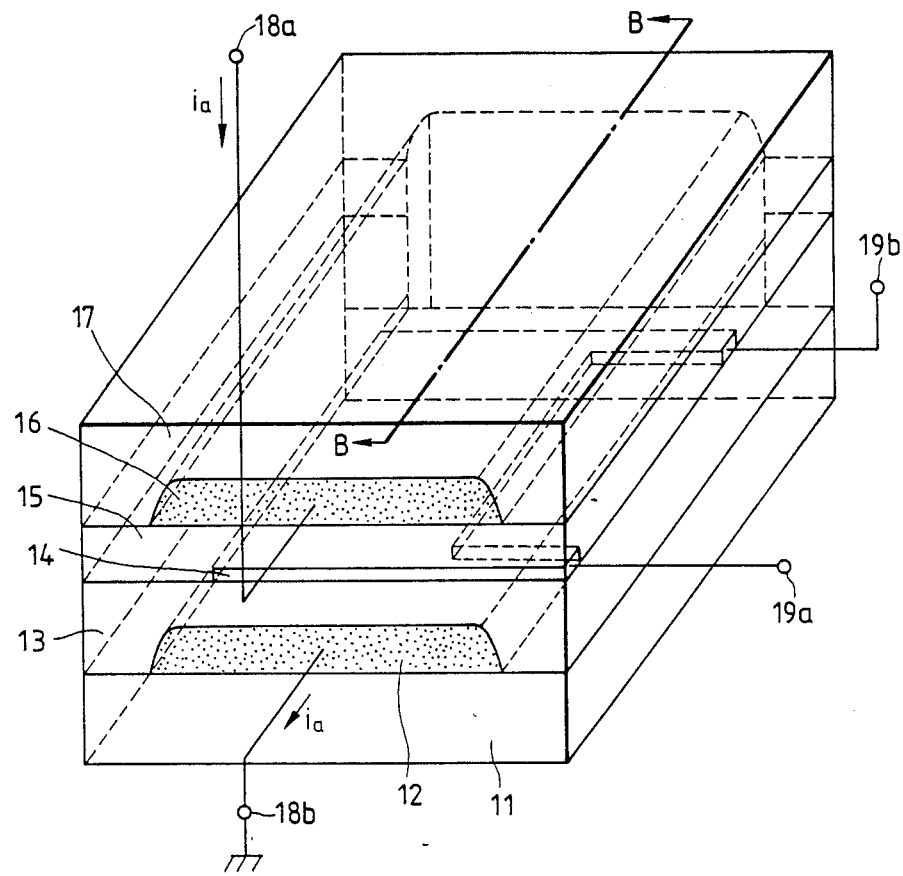
FIG. 4 is a perspective view of a current detecting device according to a second embodiment of the present invention.
Figure 5:
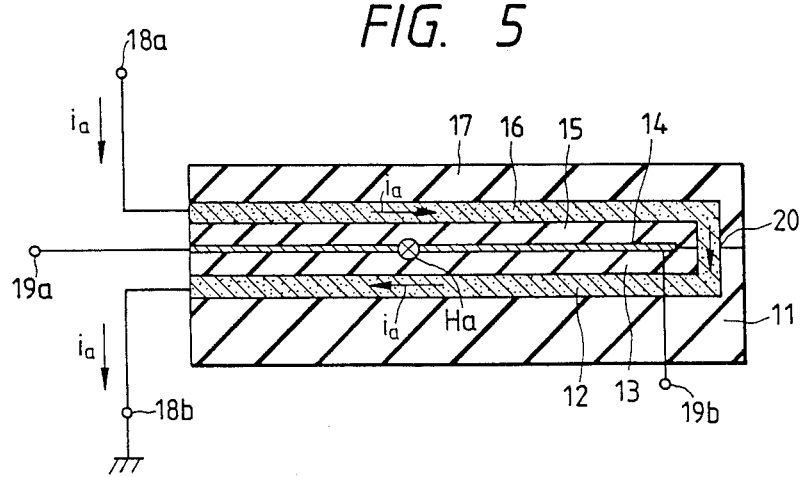
FIG. 5 is a sectional view taken along line B—B of FIG. 4.

Now, a second embodiment of the present current detecting device will be described with reference to FIGS. 4 and 5. In the second embodiment, the current detecting device comprises an insulating substrate 11, conducting layers 12 and 16 which are made by evaporating aluminum and which are connected at one side thereof to each other thereby forming a current flowing member, and insulating layers 13 and 15 including a magnetism sensing layer 14 therebetween. Both ends of the current flowing member are respectively connected to terminals 18a and 18b for the application of a current which is to be measured, and both ends of the magnetism sensing layer 14 are also respectively connected to terminals 19a and 19b for the measurement of the resistance of the magnetism sensing layer 14. In this structure, first, a first conducting layer 12 is formed on the insulating substrate 11 by using a photolithographic technique, and a first insulating layer 13 is formed on the first conducting layer 12 by sputtering method. Then the magnetism sensing layer 14 is provided by also vapor-depositing a ferromagnetic magnetoresistance element and by etching such an Al vapor-deposited layer. Second, a second insulating layer 15 is formed on the magnetism sensing layer 14 by the sputtering method, and the second conducting layer 16 is provided on the second insulating layer 15. Third, a contact hole 20 is made at one end portion thereof to connect the first conducting layer 12 with the second conducting layer 16 with the contact hole 20 being filled with Al. Finally, a second insulating layer 17 is provided on the second conducting layer 16. Thus, the magnetism sensing layer 14 is sandwiched between the insulating layers 13 and 15 thereby forming a sensing member, and the sensing member is sandwiched between the current flowing member. In other words, the magnetism sensing layer 14 is substantially interposed between the current flowing member.

Figure 15:
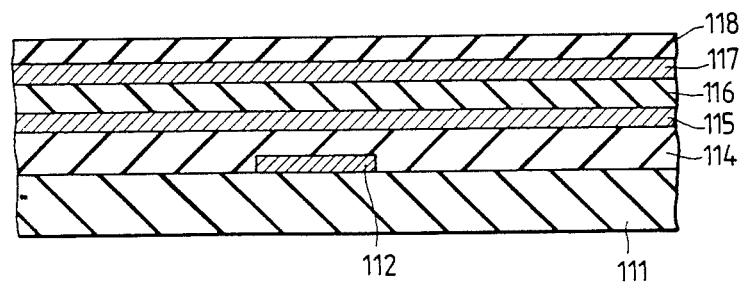
FIG. 15 is a sectional view taken along line E—E of FIG. 14.

In this structure, when a current $i_a$ is flowed from the terminal 18a toward the terminal 18b, the resistance value of the magnetism sensing layer 14 varies due to the above-mentioned magnetoresistance effect, because the magnetic field Ha is directed toward the plane of paper showing FIG. 15 as indicated by a mark ⊗. Therefore, when the resistance of the magnetism sensing layer is detected, the current $i_a$ can be measured. In the second embodiment structure, it is to be noted that the sensitivity of the magnetism sensing layer 14 is doubled in comparison with that of the first embodiment.

Figure 6:
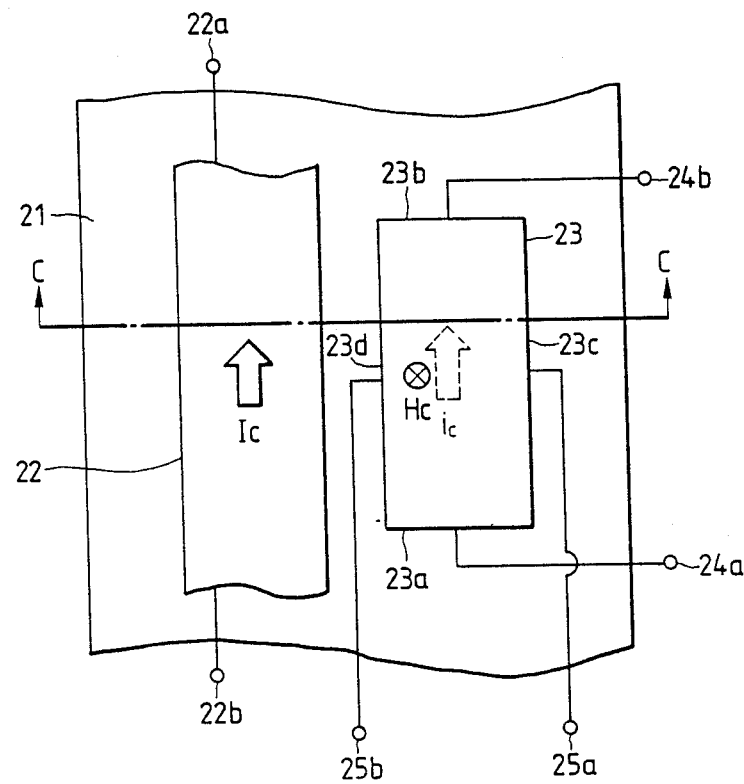
FIG. 6 is a top plan view of the current detecting device according to a third embodiment of the present invention.
Figure 7:
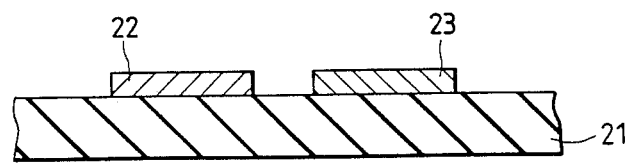
FIG. 7 is a sectional view taken along line C—C of FIG. 6.

FIG. 6 is a top plan view of the current detecting device according to a third embodiment of the present invention, and FIG. 7 is a sectional view taken along line C—C of FIG. 6. In this embodiment, the current detecting device comprises an insulating substrate 21, a conducting layer 22, a magnetism sensing layer 23. Both ends of the conducting layer 22 are respectively connected to terminals 22a and 22b for the application of a current $I_c$ which is to be measured. Besides, a first pair of opposing ends of the magnetism sensing layer 23 are respectively connected to terminals 24a and 24b for the application of a constant current $i_c$ in the direction of a dotted arrow of FIG. 6, and a second pair of opposing ends of the magnetism sensing layer 23 are respectively connected to terminals 25a and 25b for the measurement of a potential difference generated by Hall effect. The conducting layer 22 and the magnetism sensing layer 23 are provided on the insulating substrate 21 such that the current Ic flows in the same flowing direction as the current $i_c$. The magnetism sensing layer 23 can be made of InSb or GaAs, i.e. a device exhibiting Hall effect, and can be also made of a semiconductor magnetoresistance element such as InSb. In this embodiment, when the current Ic is flowed from the terminal 22a toward the terminal 22b, the magnetism sensing layer 23 receives a magnetic field Hc whose direction is directed toward the plane of paper as indicated by a mark ⊗, and when adopting a Hall element, a potential difference generates between the terminals 25a and 25b. It is to be noted that the direction of the potential difference makes the right angle with the flowing direction of current $i_c$ and the direction of the magnetic field Hc. Besides, when adopting a semiconductor magnetoresistance element, the current Ic can be measured by utilizing a property that the resistance of the semiconductor magnetoresistance element varies in accordance with the intensity of the magnetic field Hc.

Figure 8:
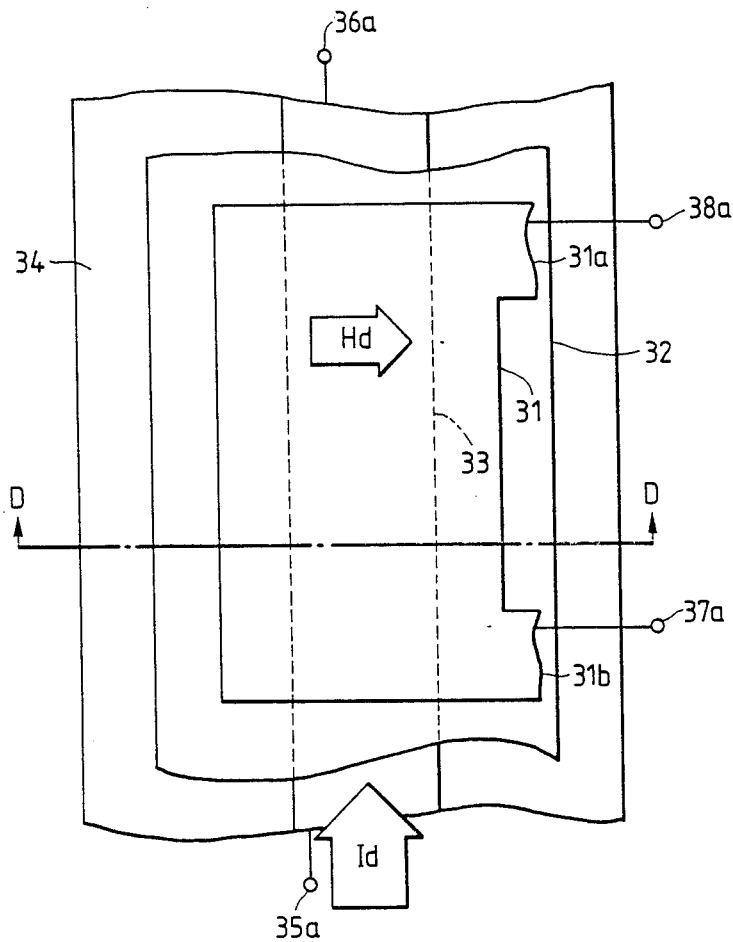
FIG. 8 is a top plan view of the current detecting device according to a fourth embodiment of the present invention.
Figure 9:
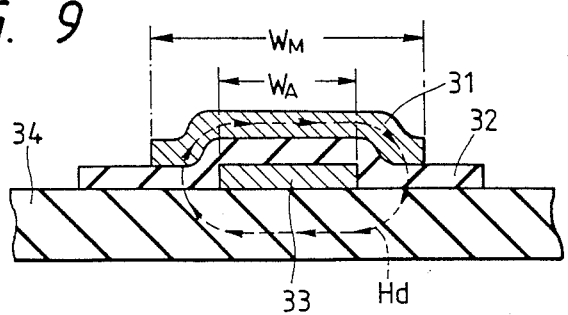
FIG. 9 is a sectional view taken along line D—D of FIG. 8.

A fourth embodiment of the current detecting device is shown in FIGS. 8 and 9. In this embodiment, the structure of the current detecting device is the same as the first embodiment except that a conducting layer 33 is located substantially below a magnetism sensing layer 31 when viewed from the magnetism sensing layer 31. Both ends of the conducting layer 33 are respectively connected to terminals 35a and 36a for the application of a current Id which is to be measured, and terminals 37a and 38a are respectively connected to both ends of the magnetism sensing layer 31. When the current Id flows from the terminal 35a toward the terminal 36a, the magnetism sensing layer 31 receives the magnetic field of Hd in the direction of an arrow. Therefore, the resistance between the terminal 37a and the terminal 38a varies in accordance with the intensity of the magnetic field Hd. As a result, the current Id can be measured by detecting the resistance therebetween.

Here, assuming that the pattern width of the conducting layer is WA, and that the pattern width of the magnetism sensing layer is WM, a preferable relation is obtained between WA and WM as follows. As will be seen from FIG. 10, a changing rate of the resistance becomes large when a ratio WM/WA ≥ 1.3, because the magnetic flux effectively passes through the magnetism sensing layer 31. In other words, the magnetic flux due to the current Id is effectively received by the magnetism sensing layer 31. In this case, the sensitivity of the current detecting device becomes high. Here, assuming that a resistance value is R(0) when the current Id is 0 mV, and that a resistance value is R(50) when Id is 50 mV, the changing rate of the resistance is given by:

$$(R(0) - R(50))/R(0)$$

In addition, Ni-Fe alloy is used as a magnetism sensing layer 31 for measuring the changing rate of the resistance. The change of the resistance between the both end portions 31a and 31b of the magnetism sensing layer 31 is very small because the intensity of the magnetic field Hd falls off at the inverse square of the distance between the conducting layer 33 and the magnetism sensing layer 31. Therefore, in the case of WM/WA > 1.3, the changing rate of the resistance is saturated.

Figure 10:
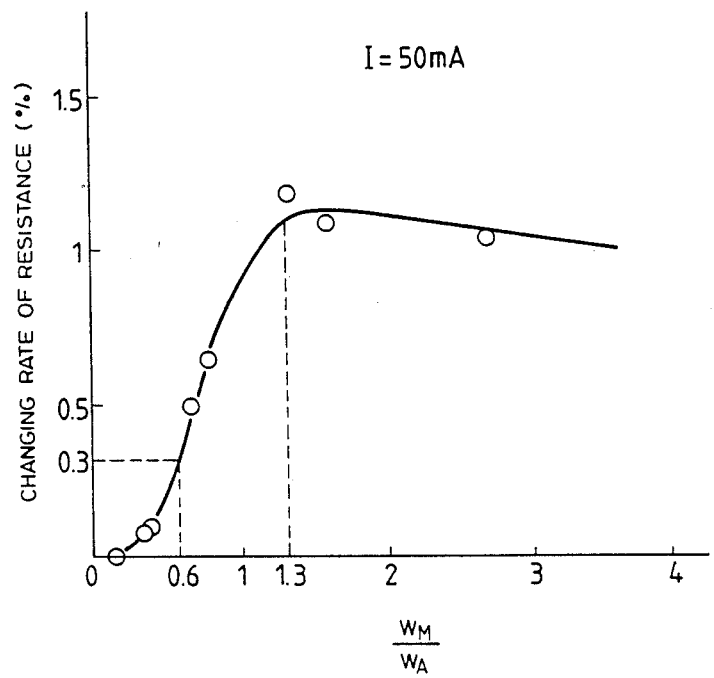
FIG. 10 is a graph showing a relation between the changing rate of resistance and the ratio of the pattern width of a magnetism sensing layer and the pattern width of a conducting layer.

When using the above-mentioned current detecting device, generally, an operational amplifier is used in order to process a small signal indicative of a resistance value. Since the offset voltage of the operational amplifier is approximately 3 mV or below in general, when the changing rate of the resistance is 0.3% or more, the current is detectable without any problem even if there is such an offset. Therefore, as shown in FIG. 10, the value of the ratio WM/WA is determined as 0.6 or more.

Figure 11:
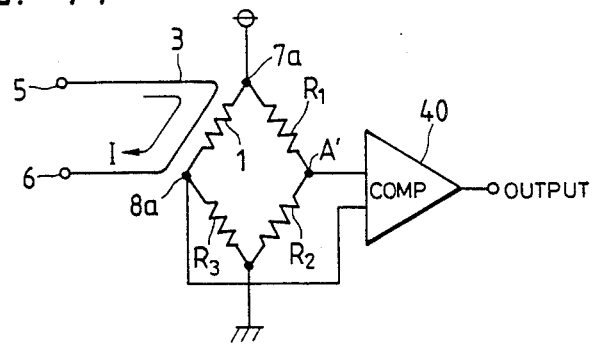
FIG. 11 is a circuit diagram of a first embodiment of a detecting circuit which can be used for the current detecting device according to the present invention.
Figure 12:
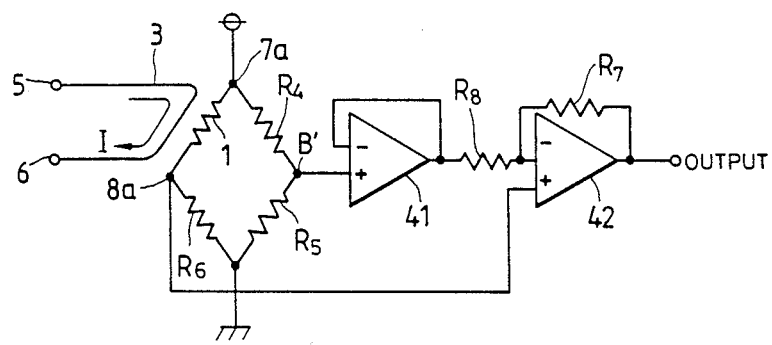
FIG. 12 is a detecting circuit of a second embodiment according to the present invention.
Figure 13:
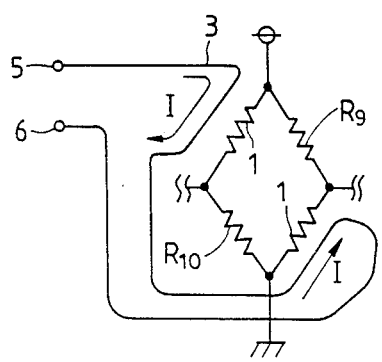
FIG. 13 is a detecting circuit of a third embodiment according to the present invention.
Figure 14:
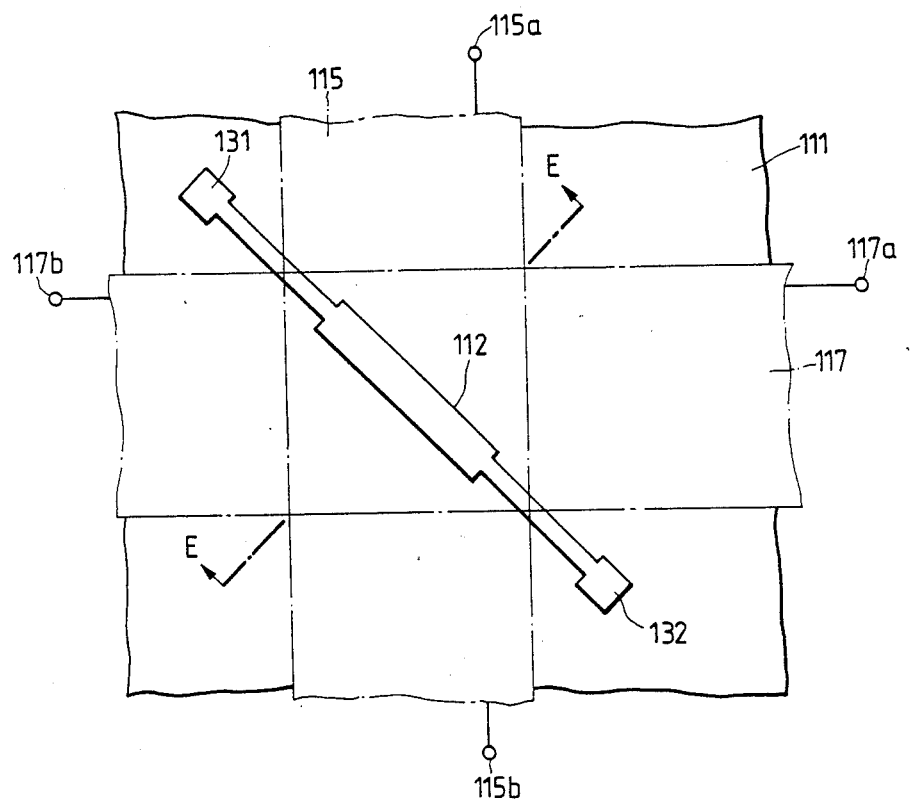
FIG. 14 is a top plan view of the current detecting device according to a fifth embodiment of the present invention.

FIGS. 11 trough 13 show detecting circuits which can be used for the present current detecting device. In FIGS. 11-13, references 1, 3, and 5-8 are corresponding to the same parts as those used in FIG. 1. In FIG. 11, the detecting circuit comprises a bridge circuit formed of the magnetism sensing layer 1 and resistors R1, R2, and R3, and a comparator 40. The terminal 8a is connected to one input terminal of the comparator 40, and a terminal electrode A' is connected to the other input terminal of the comparator 40. In this structure, for example, if the voltage of the terminal electrode A' is desirably predetermined by adjusting the resistors R1 and R2, an outputted signal can be obtained when the voltage of the terminal 8a reaches the predetermined value. In other words, the current I reaches a certain value, a signal is outputted from the comparator 40. In FIG. 12, the detecting circuit comprises a bridge circuit formed of the magnetism sensing layer 1 and three resistors R4, R5, and R6, and two operational amplifiers 41 and 42. A terminal electrode B' is connected to a noninverting input terminal of the operational amplifier 41 acting as a voltage follower, and the terminal 8a is connected to a noninverting input terminal of an operational amplifier 42 whose inverting input terminal is connected via a resistor R8 to the output terminal of the operational amplifier 41. The output terminal of the operational amplifier 42 is connected via a resistor R7 to the inverting input terminal of the operational amplifier 42. In this structure, a signal is outputted from the output terminal of the noninverting amplifying circuit in accordance with the current I which is to h=measured. Besides, as shown in FIG. 13, the bridge circuit can be formed by using two magnetism sensing layers 1 and resistors R9 and R10. In this case, there is an advantageous effect that the sensitivity of this circuit is doubled.

Now, a fifth embodiment of the current detecting device is described with reference to FIGS. 14-18. In this embodiment, the current detecting device comprises an insulating substrate 111, a magnetism sensing layer 112, two conducting layers 115 and 117, and three insulating layers 114, 116, and 118. Both ends of the magnetism sensing layer 112 are respectively connected to terminals 131 and 132 for the measurement of the resistance therebetween. The magnetism sensing layer 112 is provided on the insulating substrate 111 so as to extend in line, and a first insulating layer 114 is formed on the magnetism sensing layer 112 so as to cover the magnetism sensing layer 112. A first conducting layer 115 is provided on the first insulating layer 114, and both ends of the first conducting layer 115 are respectively connected to terminals 115a and 115b for the application of a constant current, or a bias current. A second insulating layer 116 is formed on the first conducting layer 115. Furthermore, a second conducting layer 117 is provided on the second insulating layer 116, and both ends of the second conducting layer 117 are respectively connected to terminals 117a and 117b for the application of a current which is to be measured, and a third insulating layer 118 is formed on the second conducting layer 117.

Figure 16:
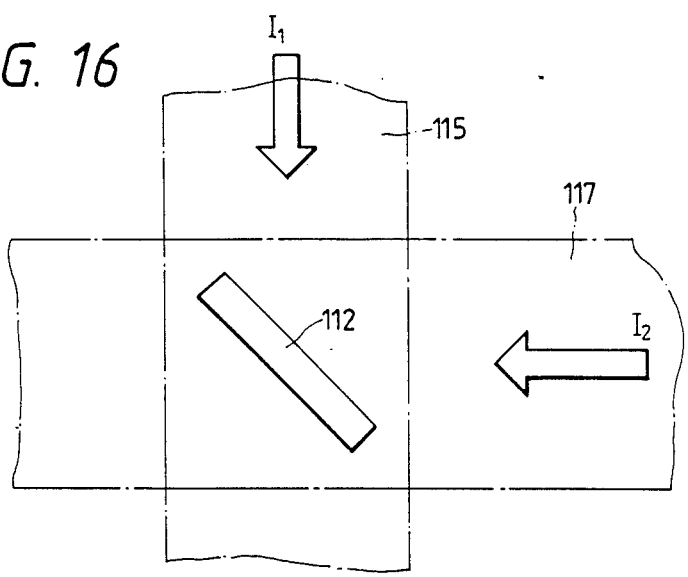
FIG. 16 is an explanatory diagram of flowing currents of FIG. 14.

It is to be noted that, as shown in FIG. 16, the direction of the constant current I1 makes the right angle with the direction of the current I2 which is to be measured, and the magnetim sensing layer 112 is provided such that the magnetism sensing layer 112 effectively receives the magnetic fields of the currents I1 and I2. In this embodiment, the magnetism sensing layer is formed at the crossing portion of the current flowing direction of the currents I1 and I2 when viewed from the third insulating layer 118. Moreover, the magnetism sensing layer 112 extends so as to make an angle of approximately 45° with the both currents I1 and I2.

Figure 17:
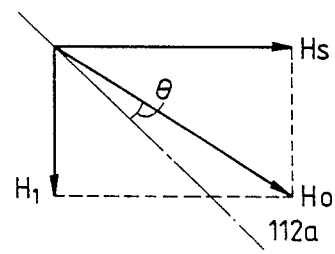
FIG. 17 is an explanatory diagram of generating magnetic fields of FIG. 14.
Figure 18:
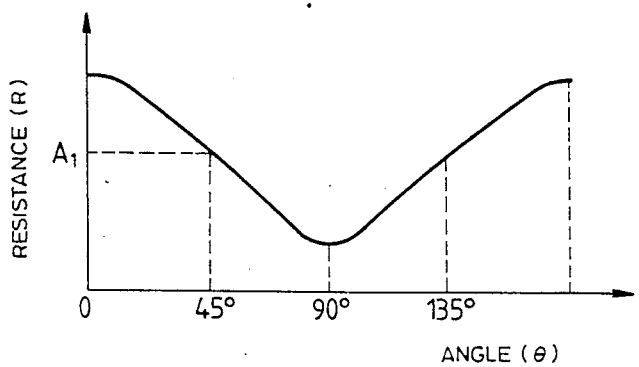
FIG. 18 is a graph showing the relationship between the resistance of a magnetism sensing layer and the direction of generating magnetic field.

The operation of this embodiment will be described hereinbelow with reference to FIG. 17. Assuming that a magnetic field due to the constant current I1 is Hs and a magnetic field due to the current I2 is Hl, when the current I1 flows from the terminal 115a toward the terminal 115b and the current I2 flows from the terminal 117a toward the terminal 117b, the direction of the combined magnetic field Ho of the magnetic fields Hs and Hl is shown in FIG. 17 as a magnetic field which is received by the magnetism sensing layer 112. Here, assuming that the extending direction of the magnetism sensing layer is 112a, and that the angle which is made by the direction of the combined magnetic field Ho and the extending direction 112a is θ, the angle θ varies in accordance with the intensity of the current I2 which is to be measured. FIG. 18 shows the relationship between the angle θ and the resistance of the magnetism sensing layer 112. Accordingly the current I2 is measured by detecting the angle θ. Furthermore, if the resistance value of the magnetism sensing layer 112, through which current I2 does not flow, is determined as a standard resistance value Al, the flowing direction of the current I2 is also detectable.

Figure 19:
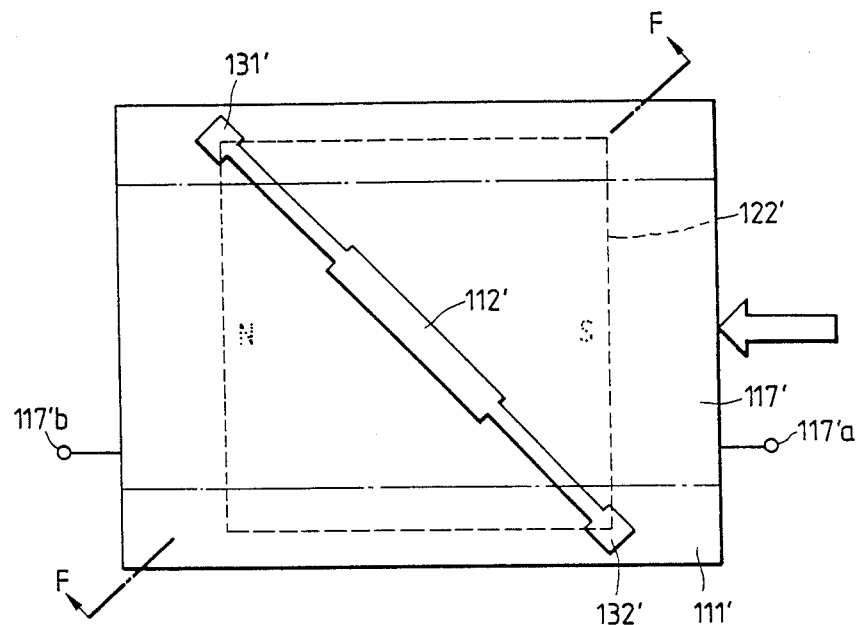
FIG. 19 is a top plan view of the current detecting device according to a sixth embodiment of the present invention.
Figure 20:
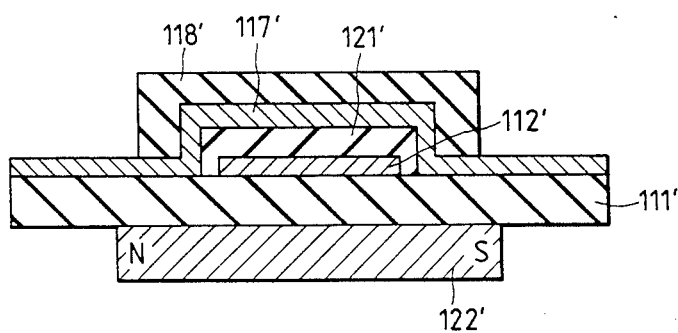
FIG. 20 is a sectional view taken along line F—F of FIG. 19.

FIG. 19 is a top plan view of the current detecting device according to a sixth embodiment of the present invention, and FIG. 20 is a sectional view taken along line F—F of FIG. 19. In this embodiment, the current detecting device comprises an insulating substrate 111', a permanent magnet 122', a magnetism sensing layer 112', a conducting layer 117', and two insulating layers 118' and 121'. Both ends of the magnetism sensing layer 112' are respectively connected to terminals 131' and 132' for the measurement of the resistance value of the magnetism sensing layer 112', and both ends of the conducting layer 117' are respectively connected to terminals 117a and 117b for the application of a current which is to be measured. The permanent magnet 122' is provided at one surface of the insulating substrate 111' for applying a bias magnetic field, and the magnetism sensing layer 112' is formed on the other surface of the insulating substrate 111'. The magnetism sensing layer 112' is covered with a first insulating layer 122', and the conducting layer 117' is provided on the first insulating layer 122'. It is to be noted that the magnetism sensing layer 112' extends in a direction making an angle of approximately 45° with the flowing direction of the current I3, and a line connecting N-pole with S-pole of the permanent magnet 122' extends the same direction as the flowing direction of the current I3 such that the permanent magnet 122', the magnetism sensing layer 112', and the conducting layer 117' are overlapped. Therefore, the magnetism sensing layer 112' effectively receives the magnetic fields of the permanent magnet 122' and the current I3. As a result, the current I3 can be measured by the similar method to the fifth embodiment.

In addition, although the permanent magnet is used in the present embodiment, an electromagnet can be also applied thereto.

Figure 21:
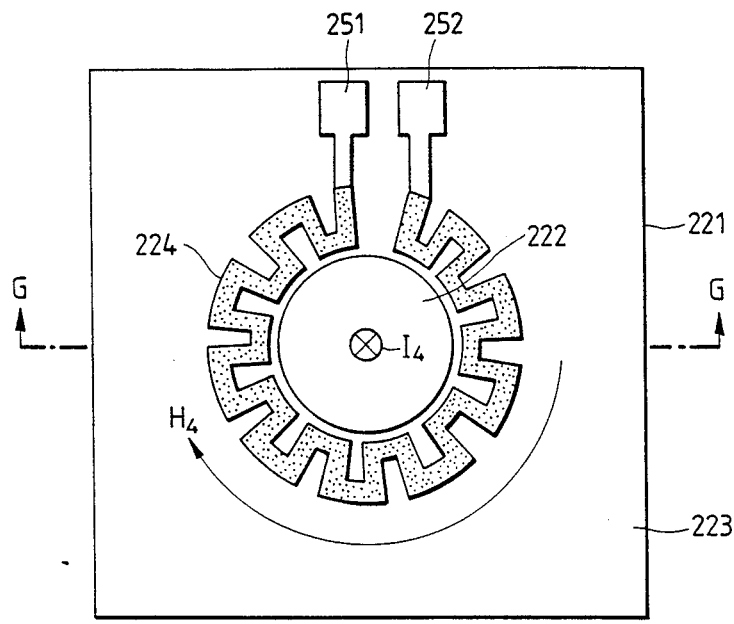
FIG. 21 is a top plan view of the current detecting device according to a seventh embodiment of the present invention.
Figure 22:
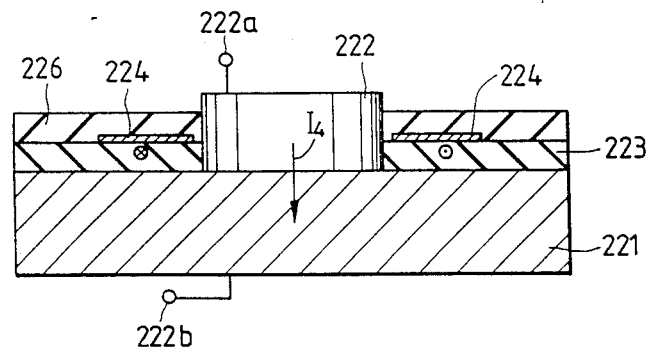
FIG. 22 is a sectional view taken along line G—G of FIG. 21.

Reference is now made to FIGS. 21 and 22 showing a seventh embodiment of the current detecting device. The current detecting device comprises a conducting substrate 221 made of Al, Co, or Si, a cylindrical conducting member 222 made of Al or Co, two insulating layers 223 and 226, and a wave-like magnetism sensing pattern 224 having a plurality of convex and concave portions alternately. More specifically, the magnetism sensing pattern has a plurality of radial line portions so that the magnetic flux passes therethrough in the direction making the right angle with the direction of a magnetic field H4. The cylindrical conducting member 222 is disposed on the conducting substrate 221 such that the conducting substrate 221 is partially covered, and the upper portion of the cylindrical conducting member 222 is connected to a first terminal 222a, and the remaning surface of the conducting substrate 221 is covered with a first insulating layer 223. The conducting substrate 221 is connected to a second terminal 222b, and the first and second terminals are used for the application of a current which is to be measured. The wave-like magnetism sensing pattern 224 is provided on the first insulating layer 223 such that the cylindrical conducting member 222 is surrounded by the wave-like magnetism sensing pattern 224, and two terminals 251 and 252 are respectively connected to both ends of the wave-like magnetism sensing pattern 224 for the measurement of the resistance therebetween. In this case, the thickness of the wave-like magnetism sensing pattern 224 is preferably determined to approximately 200–2000 angstroms. Furthermore, a second insulating layer 226 is provided on the wave-like magnetism sensing pattern 224.

When the current I4 flows from the terminal 222a to the terminal 222b, a magnetic field H4 generates around the cylindrical member 222 as shown in FIG. 21. At this time, the magnetic field H4 crosses a plurality of radial line portions of the wave-like magnetism sensing pattern 224. Accordingly, the resistance of the radial line portion is changed by the above-mentioned magnetoresistance effect in accordance with the intensity of the current I4. As a result, when the resistance of the wave-like magnetism sensing pattern 224 is detected, the current I4 can be measured. It is to be noted that since the resistance of the cylindrical member 222 can be small, it is able to flow a current of some amperes. As a result, the detection of a large current value can be achieved.

Figure 23:
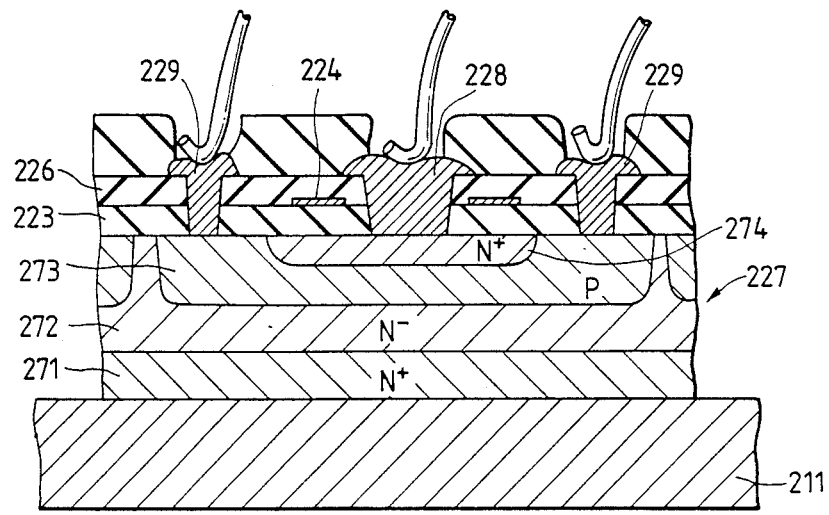
FIG. 23 is a sectional view of the current detecting device according to a eighth embodiment of the present invention.
Figure 24:
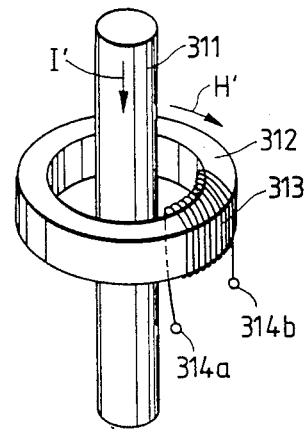
FIG. 24 is a perspective view of a conventional current detecting device.

Finally, an eighth embodiment of the current detecting device is described with reference to FIG. 23. In this embodiment, the current detecting device of the seventh embodiment is formed with a power transistor 227 as one body. The power transistor 227 is formed on a lead frame 211, and an emitter electrode is surrounded by the wave-like magnetism sensing pattern 224. More specifically, an N+ collector layer 271 is formed on the lead frame 211, and an N− grown layer 272 is provided on the N+ collector layer 271. A P-type base region 273 is formed in the N− grown layer 272, and an N+ emitter region 274 is formed in the P-type base region 273. Furthermore, the insulating layer 223 is provided on the power transistor 227, and the wave-like magnetism sensing pattern 224 is disposed on the insulating layer 223 so as to position over the N+ emitter region 274. Then the insulating layer 226 is provided on the wave-like magnetism sensing pattern 224 and the insulatin layer 226, and a hole is made in the insulating layers 223 and 226 for connecting an emitter electrode 228 to the N+ emitter region 274 as shown in FIG. 23. After this, the emitter electrode 228 is formed in the hole thereby the emitter electrode 228 is surrounded by the wave-like magnetism sensing pattern 224. Similarly, base electrodes 229 are connected to the P-type base region 273 as shown in FIG. 23.

When an emitter current, i.e. the current which is to be measuerd, flows through the emitter electrode 228, the resistance of the wave-like magnetism sensing pattern 224 is changed by the above-mentioned magnetoresistance effect in accordance with the intensity of the emitter current. Accordingly, the emitter current can be measured in the same way as that of the seventh embodiment. In this embodiment, although the power transistor is used, a semiconductor element such as FET and IGBT can be applied thereto.

From the first to eighth embodiments, it will become apparent that a high sensitivity current detecting device having no reactance component can be produced.

The above-described embodiments are just examples of the present invention, and therefore, it will be apparent for those skilled in the art that many modifications and variations may be made without departing from the scope of the present invention.

What is claimed is:

1. A current detecting device comprising:
   (a) an insulating substrate:
   (b) a conducting layer provided on said insulating substrate such that said insulating substrate is partially covered, said conducting layer having a pattern width defined between tow edges such that said edges form steps between a surface of said conducting layer and a surface of said insulating substrate, said conducting layer having two ends, both of which being respectively connected to terminals of first two-terminal means for application of a current to be measured;
   (c) an insulating layer provided on said conducting layer and said insulating substrate such that said insulating layer covers said edges; and
   (d) a magnetism sensing layer provided on said insulating layer such that said conducting layer is located below said magnetism sensing layer when viewed from said magnetism sensing layer, a pattern width of said magnetism sensing layer being larger than said pattern width of said conducting layer such that said magnetism sensing layer is overlying said edges and covering said steps, said magnetism sensing layer having two ends, both of which being respectively connected to terminals of second two-terminal means for measurement of a magnetism sensed by said magnetism sensing layer.

2. A current detecting device as claimed in claim 1, wherein a ratio WM/WA is determined as at least 1.3 where WM is the pattern width of said conducting layer so that magnetic flux due to said current to be measured is effectively received by said magnetism sensing layer.

3. A current detecting device as claimed in claim 1, wherein said magnetism sensing layer is continuously formed of a material with a characteristic that changes on a magnetic field.

4. A current detecting device as claimed in claim 3, wherein said magnetism sensing layer is made of a ferromagnetic magnetoresistance element and said characteristic is resistance.

5. A current detecting device as claimed in claim 4, wherein said magnetism sensing layer is made of a Ni-Fe alloy.

6. A current detecting device as claimed in claim 3, wherein said characteristic is resistance, and wherein a whole of said pattern width of said magnetism sensing layer functions as a detecting resistor whose resistance is measured by said second two terminal means.

7. A current detecting device as claimed in claim 1, wherein said edges of said conducting layer define a width in a direction making a right angle with a direction of connection to said magnetism sensing layer.

8. A current detecting device comprising:
   (a) a substrate;
   (b) a conducting member having two ends, both of which being respectively connected to terminals of first two-terminal means for application of a current to be measured;
   (c) a magnetism sensing member having two ends, both of which being respectively connected to terminals of second two-terminal means for measurement of a resistance of said magnetism sensing member; and
   (d) an insulating member for electrically isolating between said conducting member and said magnetism sensing member, whereby said conducting member, said magnetism sensing member, and said insulating member form a detecting member, and said detecting member being formed on said substrate; wherein a ratio Wm/Wa is determined as at least 1.3 where Wm is a pattern width of said magnetism sensing member and WA is a pattern width of said conducting member so that magnetic flux due to said current to be measured is effectively received by said magnetism sensing member.

9. A current detecting device as claimed in claim 8, wherein said magnetism sensing layer is continuously formed of a material with a characteristic that changes based on a magnetic field.

10. A current detecting device as claimed in claim 9, wherein said magnetism sensing layer is made of a ferromagnetic magnetoresistance element and said characteristic is resistance.

11. A current detecting device as claimed in claim 10, wherein said magnetism sensing layer is made of a Ni-Fe alloy.

12. A current detecting device as claimed in claim 9, wherein said characteristic is resistance, and wherein a whole of said pattern width WM of said magnetism sensing layer functions as a detecting resistor whose resistance is measured by said second two terminal means.

13. A current detecting device as claimed in claim 8, wherein said edges of said conducting layer define a width in a direction making a right angle with a direction of connection to said magnetism sensing layer.

14. A current detecting device comprising:
   (a) an insulating substrate;
   (b) a conducting layer provided on said insulating substrate such that said insulating substrate is partially covered, said conducting layer having at least one edge which forms a step between a surface of said conducting layer and a surface of said insulating substrate, said conducting layer having two ends, both of which being respectively connected to terminals of first two-terminal means for application of a current to be measured;
   (c) an insulating layer provided on said conducting layer and said insulating substrate such that said insulating layer covers said at least one edge; and
   (d) a magnetism sensing layer provided on said insulating layer such that said conducting layer is located below said magnetism sensing layer when viewed from said magnetism sensing layer, said magnetism sensing layer overlying said edge, said magnetism sensing layer having two ends, both of which being respectively connected to terminals of second two-terminal means for measurement of a resistance of said magnetism sensing layer.

15. A current detecting device as claimed in claim 14, wherein a ratio WM/WA is determined as at least 0.6 where Wm is the pattern width of said magnetism sensing layer and WA is the pattern width of said conducting layer so that magnetic flux due to said current to be measured is effectively received by said magnetism sensing layer.

16. A current detecting device as claimed in claim 15, wherein said ratio Wm/WA is determined as at least 1.3.

17. A current detecting device as claimed in claim 14, wherein said magnetism sensing layer is continuously formed of a material with a characteristic that changes based on a magnetic field.

18. A current detecting device as claimed in claim 17, wherein said magnetism sensing layer is made of a ferromagnetic magnetoresistance element and said characteristic is resistance.

19. A current detecting device as claimed in claim 18, wherein said magnetism sensing layer is made of a Ni-Fe alloy.

20. A current detecting device as claimed in claim 17, wherein said characteristic is resistance, and wherein a whole of said pattern width Wm of said magnetism sensing layer functions as a detecting resistor whose resistance is measured by said second two terminal means.

21. A current detecting device as claimed in claim 14, wherein said edges of said conducting layer define a width in a direction making a right angle with a direction of connection to said magnetism sensing layer.

* * * * *